United States Patent
Li et al.

(10) Patent No.: US 10,629,808 B2
(45) Date of Patent: Apr. 21, 2020

(54) PHASE CHANGE RANDOM ACCESS MEMORY AND FABRICATION METHOD THEREOF

(71) Applicant: Semiconductor Manufacturing International (Shanghai) Corporation, Shanghai (CN)

(72) Inventors: Zhichao Li, Shanghai (CN); Guangcai Fu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 154 days.

(21) Appl. No.: 14/813,349

(22) Filed: Jul. 30, 2015

(65) Prior Publication Data

US 2016/0064657 A1     Mar. 3, 2016

(30) Foreign Application Priority Data

Aug. 27, 2014  (CN) .......................... 2014 1 0428932

(51) Int. Cl.
   *H01L 45/00*     (2006.01)
(52) U.S. Cl.
   CPC ............ *H01L 45/06* (2013.01); *H01L 45/126* (2013.01); *H01L 45/1233* (2013.01); *H01L 45/144* (2013.01); *H01L 45/16* (2013.01)
(58) Field of Classification Search
   None
   See application file for complete search history.

(56) References Cited

U.S. PATENT DOCUMENTS

| | | | |
|---|---|---|---|
| 2003/0034560 A1* | 2/2003 | Matsuse ............ | H01L 21/28061 257/750 |
| 2003/0232496 A1* | 12/2003 | Koo .................... | H01L 21/32051 438/626 |
| 2005/0006681 A1* | 1/2005 | Okuno ................... | H01L 45/06 257/295 |
| 2006/0009034 A1* | 1/2006 | Lai ...................... | C23C 16/0281 438/680 |
| 2007/0165452 A1* | 7/2007 | Hayakawa ......... | G11C 13/0069 365/163 |
| 2008/0290467 A1* | 11/2008 | Shue ................... | H01L 27/2436 257/613 |
| 2009/0081866 A1* | 3/2009 | Lee ........................ | C23C 16/42 438/655 |
| 2009/0280643 A1* | 11/2009 | Andry ............... | H01L 21/76898 438/656 |

FOREIGN PATENT DOCUMENTS

CN     101523505 A     9/2009

* cited by examiner

*Primary Examiner* — Samuel A Gebremariam
*Assistant Examiner* — Jonas T Beardsley
(74) *Attorney, Agent, or Firm* — Anova Law Group, PLLC

(57) ABSTRACT

A method for forming a phase change random access memory is provided. The method includes providing a substrate having a surface; and forming a dielectric layer on the surface of the substrate. The method also includes forming a through-hole penetrating through the dielectric layer; and forming an adhesion layer on inner surface of the through-hole. Further, the method includes forming a metal layer doped with inorganic ions on the adhesion layer to reduce over-etching of the metal layer and increase heating efficiency of the metal layer on the surface of the adhesion layer; and forming a phase change layer on the dielectric layer, the adhesion layer and the doped metal layer.

15 Claims, 5 Drawing Sheets

PHASE CHANGE RANDOM ACCESS MEMORY AND FABRICATION METHOD THEREOF

CROSS-REFERENCES TO RELATED APPLICATIONS

This application claims the priority of Chinese patent application No. 201410428932.6, filed on Aug. 27, 2014, the entirety of which is incorporated herein by reference.

FIELD OF THE INVENTION

The present invention generally relates to the field of semiconductor technology and, more particularly, relates to Phase Change Random Access Memory and fabrication processes thereof.

BACKGROUND

Phase Change Random Access Memory (PCRAM) technology is developed based on the concept that a phase change film can be used as a phase change storage media. As a new type of non-volatile memory, PCRAM has the advantages similar to a flash memory, including fast read/write speed, more read/write cycles, long endurance, smaller unit area, and multi-value storage, etc., and it has become a most researched topic in the field of non-volatile memory.

In a PCRAM, the storage data is changed by performing a thermal treatment on the phase change layer which records the data. The phase change material of the phase change layer is able to switch between crystalline state and amorphous state according to the heating effect caused by an applied current. When the phase change layer is at the crystalline state, the resistance of the PCRAM is relatively low, the value assignment of the PCRAM is "1". When the phase change layer is at the amorphous state, the resistance of the PCRAM is relatively high, the value assignment of the PCRAM is "0". Therefore, the PCRAM is a non-volatile memory using the resistance difference of the phase change layer at the crystalline state and the amorphous state.

FIG. 1 illustrates an existing PCRAM. As shown in FIG. 1, the PCRAM includes a substrate 10. Metal interconnect structures are formed in the substrate 10. The PCRAM also includes a dielectric layer 20 formed on the substrate 10. Further, a bottom contact electrode 21 is formed in the dielectric layer 20. The bottom contact electrode 21 is connected with the metal interconnect structures in the substrate 10. Further, the PCRAM also includes a phase change layer 22 formed on the dielectric layer 20 and the bottom contact electrode 21.

When the bottom contact electrode 21 is connected with an electrical power source, the bottom contact electrode 21 is able to generate heat; and the phase change layer 22 is heated. Thus, the crystallinity of the phase change layer 21 is changed; and the logic value stored in the phase change layer 21 is changed.

However, the performance of the PCRAM needs further improvements. The disclosed device structures and methods are directed to at least partially solve such a problem and related problems.

BRIEF SUMMARY OF THE DISCLOSURE

One aspect of the present disclosure includes a method for fabricating a phase change random access memory. The method includes providing a substrate having a surface; and forming a dielectric layer on the surface of the substrate. The method also includes forming a through-hole penetrating through the dielectric layer; and forming an adhesion layer on the inner surface of the through-hole. Further, the method includes forming a metal layer doped with inorganic ions on the adhesion layer to reduce over-etching of the metal layer and increase heating efficiency of the metal layer on the surface of the adhesion layer; and forming a phase change layer on the dielectric layer, the adhesion layer and the doped metal layer.

Another aspect of the present disclosure includes a phase change random access memory. The phase change random access memory includes a substrate having a surface; and a dielectric layer formed on the surface of the substrate. The phase change random access memory also includes a through-hole penetrating through the dielectric layer formed in the dielectric layer; and an adhesion film formed on the inner surface of the through-hole. Further, the phase change random access memory includes a metal film doped with inorganic ions formed on the adhesion layer to reduce over-etching of the metal film and increase heating efficiency of the metal film formed on the adhesion film; and a phase change layer formed on the dielectric layer, the adhesion film and the doped metal film.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As described previously, the performance of the PCRAM may need further improvements. The bottom electrode contactor (BEC), i.e., connecting an electrode, or metal interconnect structure with the phase change layer, of the PCRAM is usually made of W or TiN. For such a structure, the filling ability W may be able to match the desired requirements, but the filling ability of TiN may be unable to match the desired requirements. Thus, the contact performance of the BEC may be unable to match the desired requirements; and the properties of the PCRAM may be affected.

One reason affecting the contact performance of the BEC may be from the fabrication processes. During a planarization process for forming the BEC, the polishing solution may include ammonia and hydrogen peroxide, etc. Under an alkaline condition, W may be easily oxidized to form $WO_3$. $WO_3$ may have a relatively high polishing rate. Thus, during the planarization process using a chemical mechanical polishing process, the BEC may be over-polished. The over-polishing of the BEC may cause the top surface of the BEC to be recessed from the dielectric layer, i.e., concave-shaped. Thus, the contact quality between the BEC and the phase change layer may be unable to match the desired requirements. Therefore, the performance of the PCRAM units may be affected; and the yield of PCRAM may be reduced.

Increasing the top area of the BEC may improve the recessing issue. However, increasing the top area of the BEC may increase the contact area between the BEC and the phase change layer. Thus, the heating area of the phase change layer may be increased; and the power consumption of the PCRAM unit may be increased. Further, the resistance of the BEC made of W may be relatively low, and the thermal conductivity may be relatively high. Thus, when W is used as the material of the BEC, the heating efficiency may be relatively low. According to the disclosed device structures and processes, the recess issue caused by the over-etching, the low heating efficiency issue and other related issues may be at least partially overcome by using doped metal as the material of the BEC.

Figure 7:
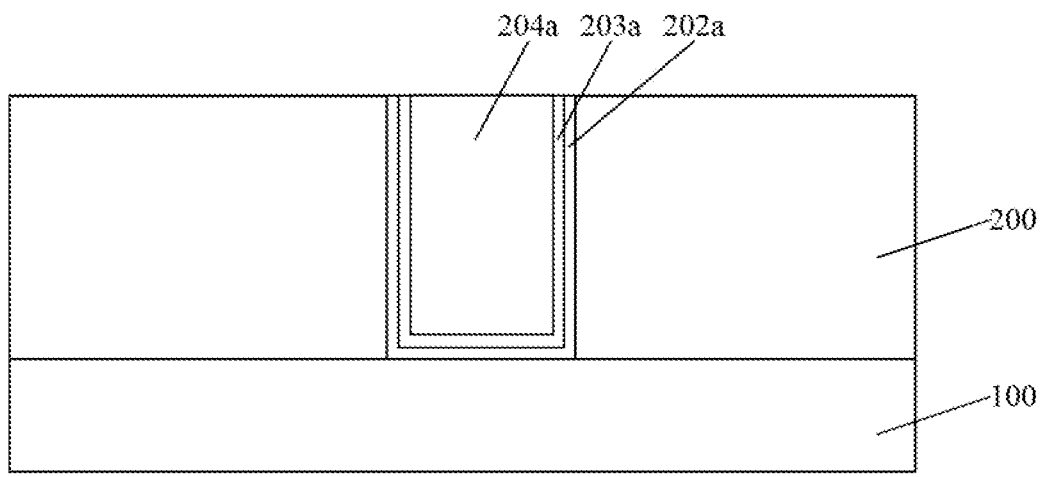
Figure 8:
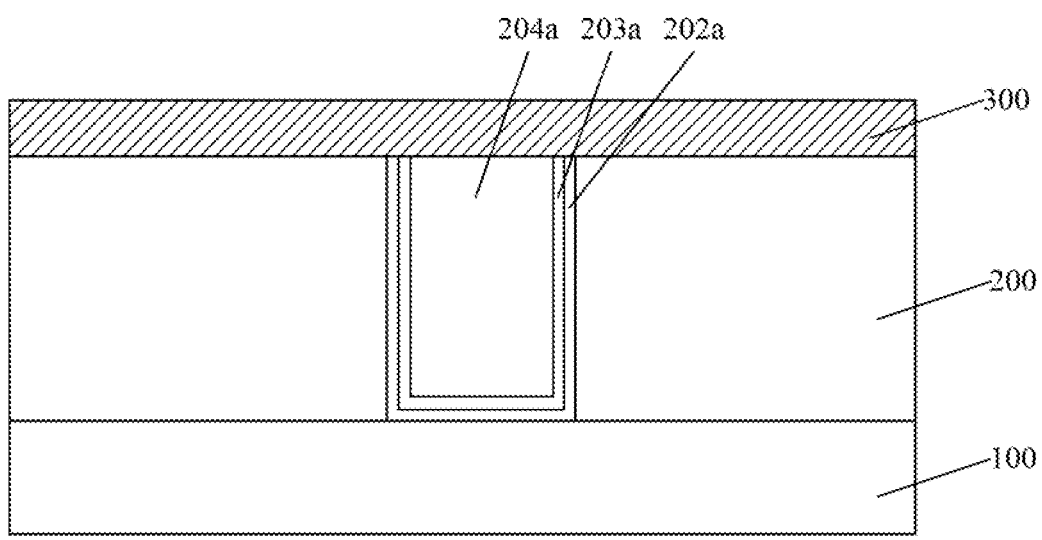
Figure 9:
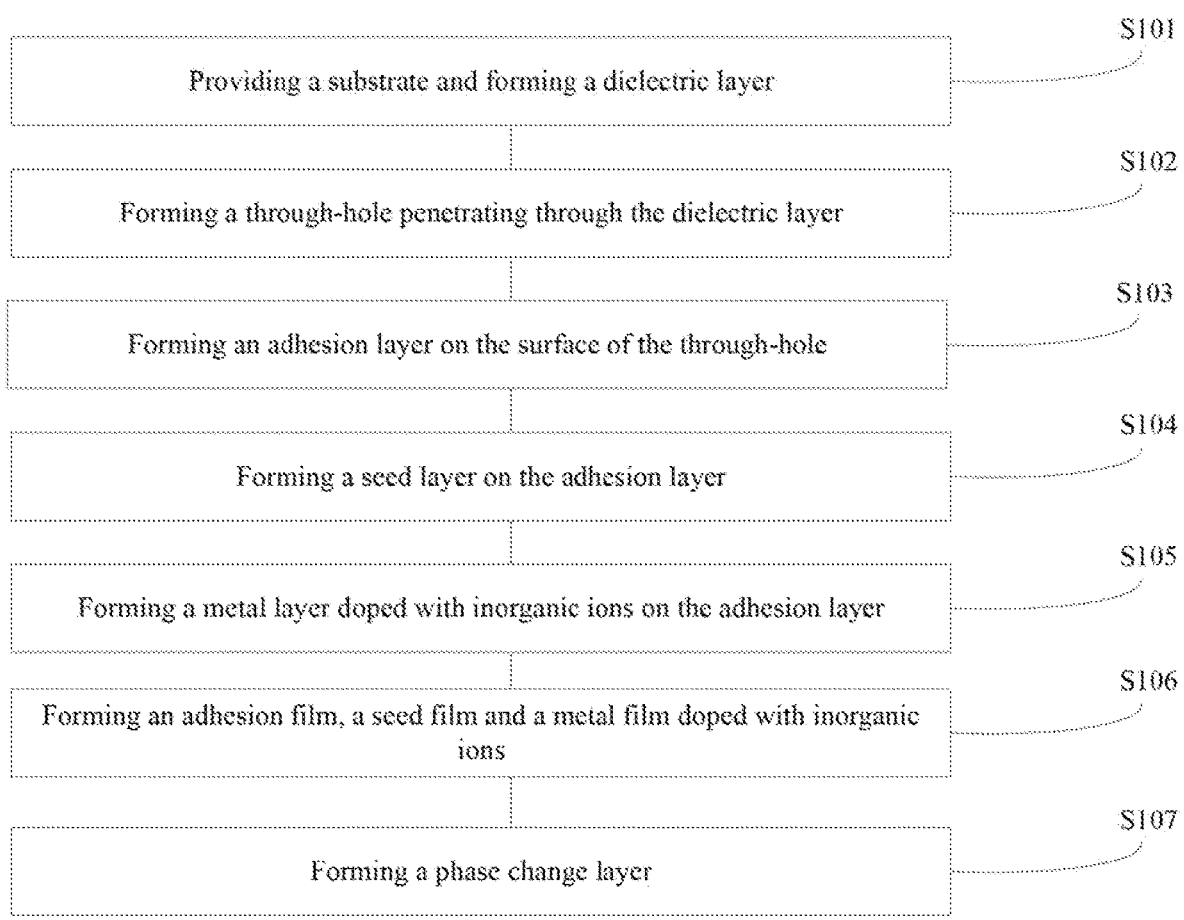
FIG. 9 illustrates an exemplary fabrication process of a PCRAM consistent with the disclosed embodiments.

FIG. 9 illustrates an exemplary fabrication process of a phase change random access memory (PCRAM) consistent with the disclosed embodiments; and FIGS. 2-8 illustrate certain structures corresponding certain stages of the exemplary fabrication process of the PCRAM.

Figure 1:
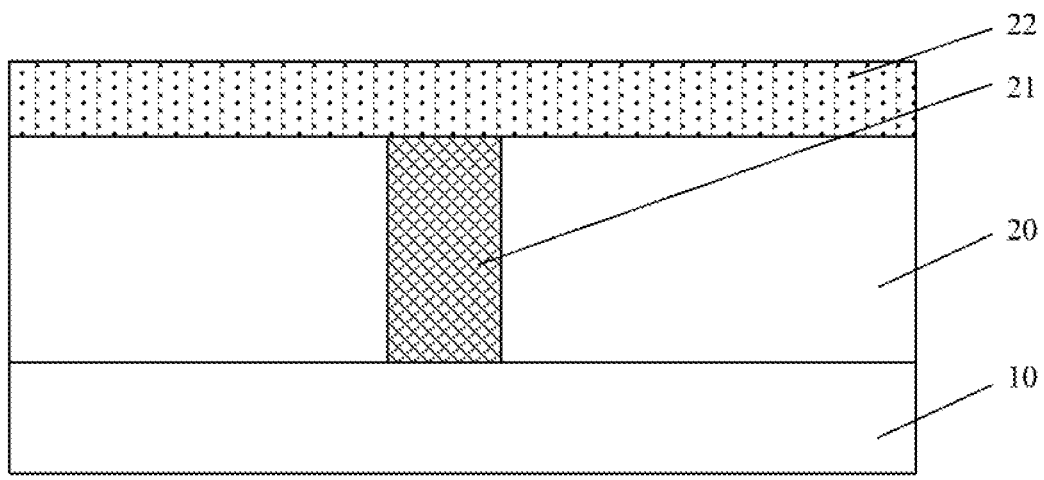
FIG. 1 illustrates an existing PCRAM.
Figure 2:
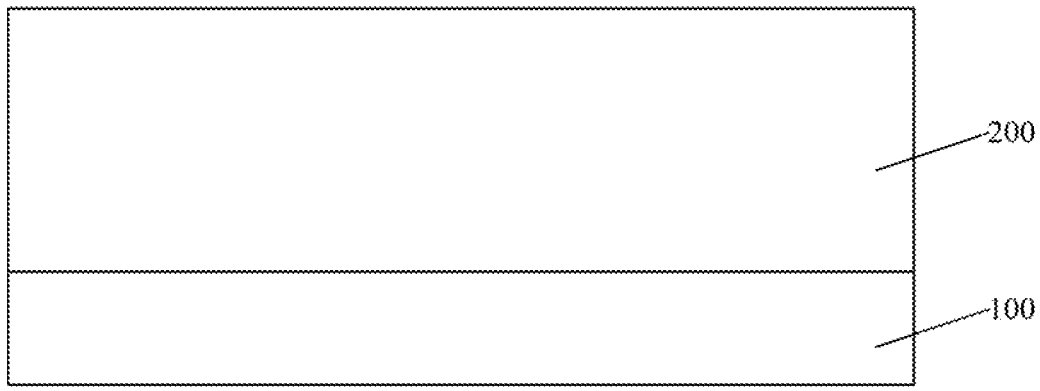
FIGS. 2-8 illustrate structures corresponding to certain stages of an exemplary fabrication process of a PCRAM consistent with the disclosed embodiments.

As shown in FIG. 9, at the beginning of fabrication process, a substrate with certain structures is provided (S101). FIG. 2 illustrates a corresponding structure.

As shown in FIG. 2, a substrate 100 is provided. Further, a dielectric layer 200 may be formed on a surface of the substrate 100.

The substrate 100 may be made of any appropriate material. In one embodiment, the substrate 100 is made of dielectric material, such as silicon oxide, etc. In certain other embodiments, the substrate 100 may be made of insulation material, such as SiOC, SiON, or SiC, etc. The substrate 100 provides a base for subsequent devices and processes.

The substrate 100 may be a dielectric layer formed on a semiconductor substrate. A plurality of the semiconductor devices, and interconnect structures, etc., may be formed in the semiconductor substrate. The semiconductor devices, such as transistors, etc., may be used to control the subsequently formed PCRAM unit.

Further, a plurality of metal interconnect structures (not labeled) may be formed in the substrate 100. The top surfaces of the metal interconnect structures may level with the surface of the substrate 100. A bottom electrode contactor (BEC) may be subsequently formed on the substrate 100. The BEC may be connected with the metal interconnect structures, such as a W-plug, etc. That is, the BEC may be formed on the portion of the metal interconnect structure exposed by the substrate 100. The metal interconnect structures may supply a voltage to the PCRAM.

The dielectric layer 200 may be made of any appropriate material, such as low dielectric constant (low-K) material, or ultra-low-K material, such as SiON, or SiOC, etc. Various processes may be used to form the dielectric layer 200, such as a low-temperature chemical vapor deposition (CVD) process, or a plasma-enhanced CVD (PECVD) process, etc. The dielectric layer 200 may also be formed by a physical vapor deposition (PVD) process, or an atomic layer deposition (ALD) process, etc.

Optionally, a barrier layer (not shown) may be formed on the substrate 100 before forming the dielectric layer 200. The barrier layer may be made of dense metal material, such as Ti, TiN, Ta, or TaN, etc. The barrier layer may protect the surface of the substrate 100 during a subsequently etching process for forming a through-hole in the dielectric layer 200. Further, the barrier layer may prevent the metal atoms of the subsequently formed metal layer in the dielectric layer 200 from diffusing into the substrate 100. Further, the barrier layer may also be able to prevent the reaction gas of a subsequent process from reacting with the substrate 100 and the dielectric layer 200. Further, the barrier layer and the dielectric layer 200 may have a relatively high adhesive force.

Figure 3:
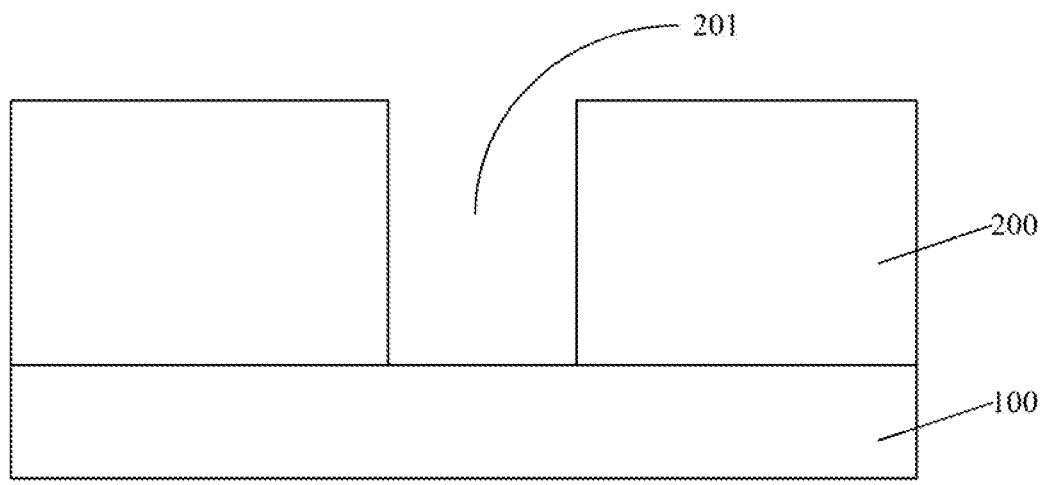

Returning to FIG. 9, after providing the substrate 100 and forming the dielectric layer 200, a through-hole may be formed in the dielectric layer 200 (S102). FIG. 3 illustrates a corresponding structure.

As shown in FIG. 3, a through-hole 201 penetrating through the dielectric layer 200 is formed in the dielectric layer 200. The bottom of the through-hole 201 may be on the exposed portion of the metal interconnect structures formed in the substrate 100. Thus, the subsequently formed BEC may be formed on the exposed portion of the metal interconnect structure.

In one embodiment, the exposed portion of the metal interconnect structure may be a W-plug formed in the substrate 100. The W-plug may be used as a portion of the bottom electrode of the PCRAM; or the W-plug may be configured as the bottom electrode of the PCRAM. The BEC may be formed on the W-plug.

The width of the through-hole 201 may be any appropriate value. In one embodiment, the width of the through-hole 201 may be in a range of approximately 20 nm~200 nm.

The cross-section of the through-hole 201 parallel to the surface of the substrate 100 may be any appropriate shape, such as a circle, a rectangle, or a triangle, etc. In one embodiment, the cross-section of the through-hole 201 is a circle. The diameter of the through-hole 201 may be in a range of approximately 20 nm~200 nm.

A process for forming the through-hole 201 may include forming a mask layer having an opening defining the size and position of the through-hole 201 on the surface of the dielectric layer 200; and etching the dielectric layer 201 using the mask layer an etching mask until the surface of the substrate 100, or the exposed surface of the metal interconnect structure is exposed. Thus, the through-hole 201 may be formed.

The mask layer may be made of any appropriate material, such as photoresist, amorphous silicon, or silicon nitride, etc. After forming the through-hole 201, the mask layer may be removed by a wet etching process, or a plasma ashing process, etc.

Various processes may be used to etch the dielectric layer 200, such as a dry etching process, a wet etching process, or an ion beam etching process. The etching process may be an isotropic etching process, or an anisotropic etching process. In one embodiment, the dielectric layer 200 is etched by an anisotropic dry etching process, for example, a plasmas etching process. The etching gas of the plasma etching process may include any appropriate gas, such as $CF_4$, $C_2F_6$, or $C_3F_8$, etc.

Figure 4:
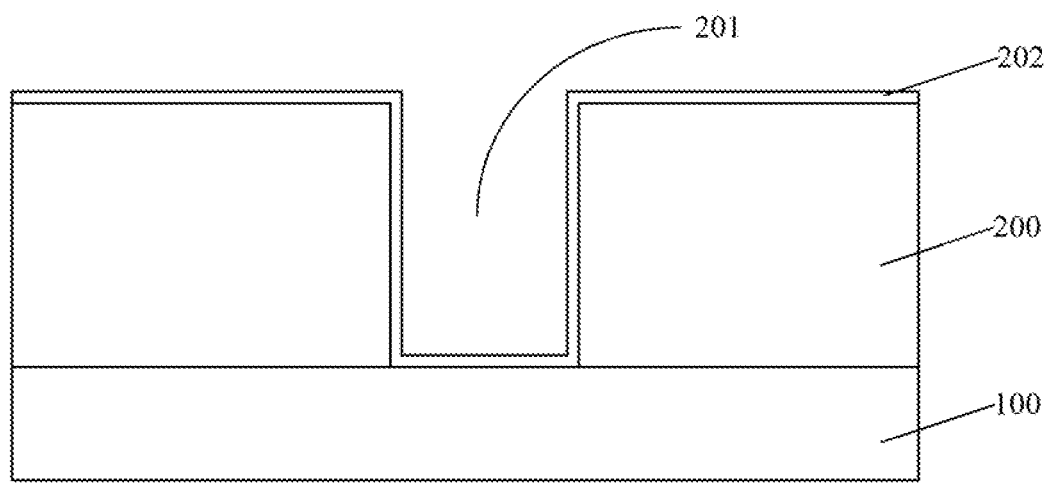

Returning to FIG. 9, after forming the through-hole 201, an adhesion layer may be formed (S103). FIG. 4 illustrates a corresponding structure.

As shown in FIG. 4, an adhesion layer 202 is formed on the inner surface of the through-hole 201. The adhesion layer 202 may be used to increase the adhesion between the dielectric layer 200 and the subsequently formed seed layer and BEC. Further, the adhesion layer 202 may also prevent the reaction gas of the subsequent process for forming a metal layer from reacting with the substrate 100.

The adhesion layer 202 may be a single layer structure, or a multiple-layer structure; and made of any appropriate material. In one embodiment, the adhesion layer 202 is a double-layer structure. The adhesion layer 202 may include a Ti layer formed on the inner surface of the through-hole 201, and a TiN layer formed on the Ti layer. In certain other embodiments, the adhesion layer 202 may include a Ta layer formed on the inner surface of the through-hole 201, and TaN layer formed on the Ta layer. Various processes may be used to form the adhesion layer 202, such as a chemical vapor deposition (CVD) process, a physical vapor deposition (PVD) process, or an atomic layer deposition (ALD) process, etc The thickness of the adhesion layer 202 may be in a range of approximately 50 Å~500 Å. In one embodiment, the adhesion layer 202 may also cover the surface of the dielectric layer 200. The portion of the adhesion layer 202 on the surface of the dielectric layer 200 may be subsequently removed by a planarization process.

Figure 5:
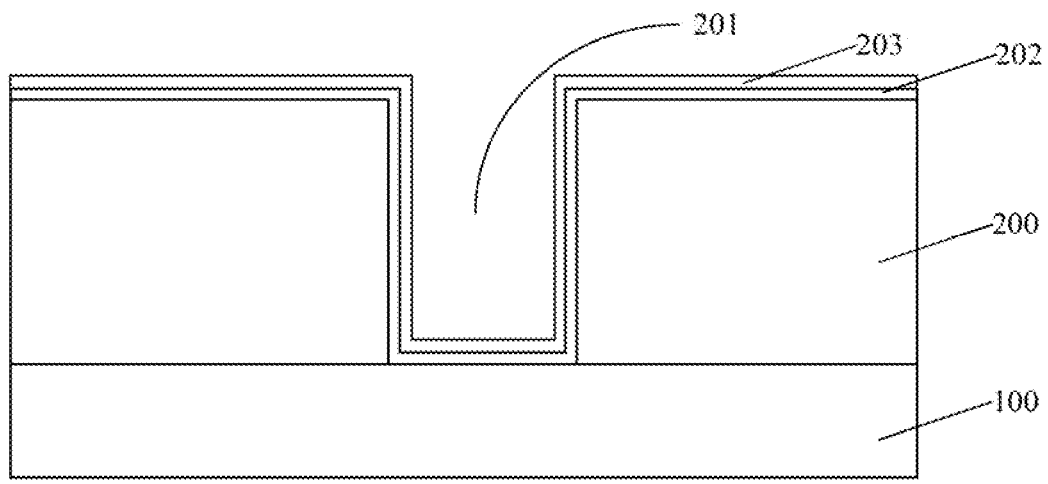

Returning to FIG. 9, after forming the adhesion layer 202, a seed layer may be formed (S104). FIG. 5 illustrates a corresponding structure.

As shown in FIG. 5, a seed layer 203 is formed on the surface of the adhesion layer 202. The seed layer 203 may increase the adhesion force between the adhesion layer 202 and the subsequent formed metal layer.

The seed layer 203 may be made of any appropriate material. In one embodiment, the seed layer 203 is made of tungsten (W).

Various processes may be used to form the seed layer 203, such as a CVD process, or a PVD process, etc. In one embodiment, a CVD process is used to form the seed layer 203.

In one embodiment, the seed layer 203 is made of W, the reaction gas of the CVD process for forming the seed layer 203 may include $WF_6$ and $SiH_4$, etc. In one embodiment, the mole ratio of $WF_6$ and $SiH_4$ may be greater than ⅔. Pure W may be formed by the reaction of the $WF_6$ and $SiH_4$. The chemical equation of the reaction may be wrote as:

$$2WF_6 + 3SiH_4 = 2W + 3SiF_4 + 6H_2$$

According to the chemical equation, when the ratio of $WF_6$ and $SiH_4$ is greater than ⅔, $WF_6$ is superfluous. Thus, pure W may be formed. That is, un-doped W may be used as the seed layer 203. When a doped-metal layer is subsequently formed in the through-hole 201, the seed layer 203 may increase the adhesion force between the doped-metal layer and the adhesion layer 202.

In certain other embodiment, the ratio (concentration) of $SiH_4$ may be increased to cause $SiH_4$ to be superfluous. Thus, Si may be formed in the seed layer 203. Such a reaction may include two steps.

The first step may be referred as a soaking process, in which a Si layer (or seed particles) may be formed. The chemical reaction for the soaking process may be written as:

$$SiH_4 = Si + 2H_2$$

Such a process may also be referred as $SiH_4$ initiation. The Si layer may be used as nucleation sites for subsequent forming the seed layer 203; and a doped-metal layer. The Si layer may also protect the adhesion layer 202 from reacting with the reaction gas for forming the doped-metal layer. Thus, the Si layer may be referred as a protective layer.

The second step may be referred as a nucleation process, in which tungsten-silicon compound may be formed. The chemical equation of the nucleation process may be written as:

$$2WF_6 + 5SiR_4 = 2WSi + 3SiF_4 + 10H_2$$

Thus, WSi may be formed. The WSi may be referred as a foundation layer. After the two steps, the seed layer 203 may be doped with Si. In certain other embodiments, Si, W, and WSi may co-exist.

In one embodiment, the seed layer 203 may be un-doped; and the adhesion force between the seed layer 203 and the adhesion layer 202 may be increased. Thus, the quality of the interface between the adhesion layer 202 and the subsequently formed metal layer may be improved.

In certain other embodiments, $SiH_4$ reacting with $WF_4$ may be substituted by one or more of $CH_4$, $GeH_4$, or $NH_3$, etc. Thus, the seed layer 203 may be doped with C ions, Ge ions, or N ions, etc.

Doping certain ions in the seed layer 203 may increase the resistance of the seed layer 203 and reduce the thermal conductivity of the seed layer 203. The doped seed layer 203 may be a portion of the BEC. Thus, the power consumption of the PCRAM unit having such a BEC may be reduced; and the performance of the PCRAM may be enhanced.

In certain other embodiments, the seed layer 203 may be made of other appropriate material chosen according to the subsequently formed BEC. In still certain other embodiments, the seed layer 203 may be omitted; and a doped-metal layer may be directly formed on the adhesion layer 202.

Figure 6:
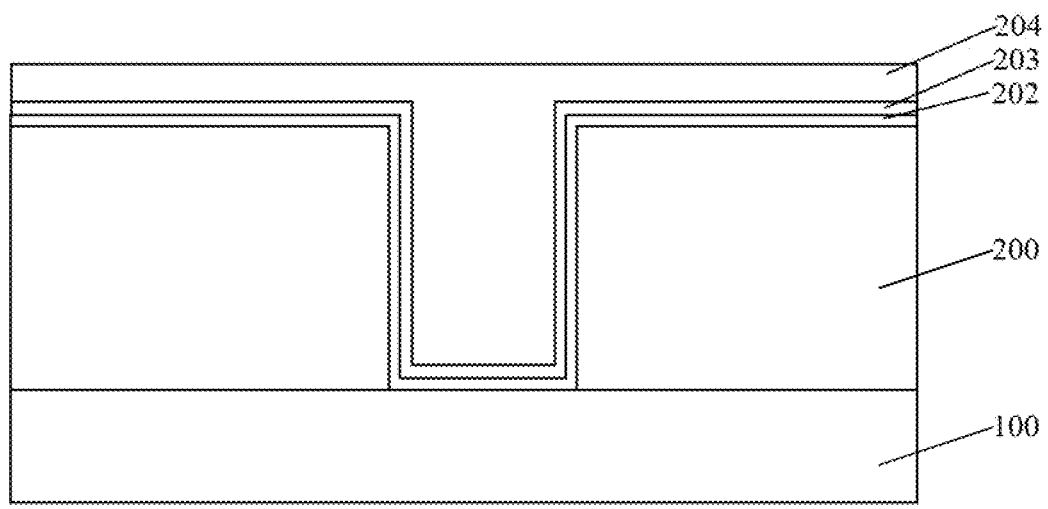

Returning to FIG. 9, after forming the seed layer 203, a metal layer may be formed (S105). FIG. 6 illustrates a corresponding structure.

As shown in FIG. 6, a metal layer 204 is formed on the surface of the seed layer 204. Further, the metal layer 204 may fill the through-hole 201. The metal 204 layer may be doped with certain doping ions. The doping ions of the doped metal layer 204 may be inorganic ions.

The metal layer 204 may be made of any appropriate material. In one embody metal, the doped metal layer 204 may be made of a material identical to the seed layer 203, such as W, etc. The inorganic doping ions in the doped metal layer 204 may be C ions, N ions, Ge ions, or Si ions, etc.

Various processes may be used to form the doped metal layer 204, such as a CVD process, a PVD process, or an ALD process, etc. In one embodiment, the doped metal layer 204 with inorganic doping ions may be formed by a CVD process. The reaction gas of the CVD process may include a W-containing gas and a doping gas, etc. The W-containing gas may be $WF_6$, etc. The doping gas may include one or more of $SiH_4$, $CH_4$, $GeH_4$, and $NH_3$, etc.

Specifically, the flow rate of $WF_6$ may be in a range of approximately 20 sccm~500 sccm. The flow rate of the doping gas may be in range of approximately 20 sccm~500 sccm. The reaction temperature may be in a range of approximately 300° C.~500° C. The reaction pressure may be in range of approximately 0.5 Torr~50 Torr.

$WF_6$ and the doping gas may be introduced into the reaction chamber of the CVD process simultaneously, or separately. In one embodiment, $WF_6$ and the doping gas are introduced into the reaction chamber simultaneously. The ratio of $WF_6$ and the doping gas may be greater than ⅔. According to the previously described chemical equations, metal W layer doped with inorganic ions may be formed.

In certain other embodiments, after forming the seed layer 203, reaction gases similar as those used for forming the seed layer 203, i.e., $WF_6$ and $SiH_4$, may be continuously introduced into the same reaction chamber. By increasing the flow rate of $SiH_4$, the concentration of $SiH_4$ in the reaction chamber may be increased. Thus, Si-doped metal layer 204 may be formed.

In one embodiment, the mole ratio of $WF_6$ and $SiH_4$ of the CVD process may be approximately of 2:5. The mole ratio of Si and W in the doped metal layer 204 may be approximately 1:1. The chemical equation of such a reaction may be written as:

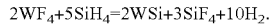

In certain other embodiments, the mole concentration of the inorganic doping ions in the doped metal layer 204 may be in a range of approximately 0~66%. The inorganic doping ions in the doped metal layer 204 may be able to increase the hardness of the doped metal layer 204. Further, chemical bonds, such as W—Si bonds, W—Ge bonds, W—C bonds, or W—N bonds, etc., may be formed in the doped metal layer 204. The bonding strength of such chemical bonds may be relatively large; and may be greater than the bonding strength of the W—O bonds. During a subsequent process for polishing the doped metal layer 204, the doped metal layer 204 may be uneasy to be oxidized. Thus, the polishing rate of the doped metal layer 204 may be reduced; and the over-polishing issue may be overcome.

Further, the doping ions in the doped metal layer 204 may be inorganic ions. The conductivity of the inorganic doping ions may be relatively low. Comparing with a pure meta layer, the resistance of the doped metal layer 204 may be increased. Thus, the heating efficiency of the doped metal layer 204 under a same electrical current may be improved.

The mole concentration of the inorganic doping ions in the doped metal layer 204 may be smaller than approximately 66%. Such a range of the mole concentration of the inorganic doping ions may prevent the doped metal layer 204 from having a significantly large resistance. If the resistance of the doped metal layer 204 is significantly large, the conductive property of the doped metal layer 204 may be adversely affected. For example, the significantly large resistance of the doped metal layer 204 may cause the PCRAM to have a significantly large drive voltage. Thus, the power consumption of the PCRAM may be increased.

Further, the thermal conductivity of the inorganic doping ions may be relatively low. For example, the thermal conductivity of Si is approximately 0.34 W/(cm·K); and the thermal conductivity of W is approximately 1.74 W/(cm·K). Thus, comparing the pure metal layer, the thermal conductivity of the doped metal layer 204 may be reduced. Therefore, the heat dissipation rate of the doped metal layer 204 may be reduced; and the power consumption of the PCRAM unit may be reduced.

Returning to FIG. 9, after forming the doped metal layer 204, an adhesion film, a seed film and a doped metal film may be formed (S106). FIG. 7 illustrates a corresponding structure.

As shown in FIG. 7, an adhesion film 202a, a seed film 203a and a doped metal film 204a are formed. The adhesion film 202a, the seed film 203a and the doped metal film 204a may be formed by planarizing the doped metal layer 204, the seed layer 203 and the adhesion layer 202 using the dielectric layer 200 as a stop layer.

The doped metal layer 204, the seed layer 203 and the adhesion layer 202 may be planarized by any appropriate process, such as a chemical mechanical polishing process, a physical mechanical polishing process, or an ion beam polishing process, etc. In one embodiment, a chemical mechanical polishing process is used to planarize the doped metal layer 204, the seed layer 203 and the adhesion layer 202.

The polishing slurry of the chemical mechanical polishing process may include any appropriate chemicals. In one embodiment, the polishing slurry of the chemical mechanical polishing process includes a mixture of the ammonia and hydrogen peroxide, etc. During the planarization process, the doped metal layer 204 may have a relative low polishing rate to such a polishing slurry for a plurality of reasons. First, the doped metal layer 204 may be doped with inorganic ions; and the hardness of the doped metal layer 204 may be increased. Second, W—Si bonds, W—Ge bonds, W—C bonds, W—C bonds, or W—N bonds, etc., may be formed in the doped metal layer 204. The bonding strength of such chemical bonds may be greater than the bonding strength of W—O bonds. Thus, W—Si bonds, W—Ge bonds, W—C bonds, W—C bonds, or W—N bonds, etc., may be not easily oxidized during the planarization process. Therefore, due to the relatively low etching rate of the doped metal layer 204, when the planarization process reaches the surface of the dielectric layer 200, the doped metal layer 204 in the through-hole 201 (referring to FIG. 5) may not be over-etched.

After the planarization process, portions of the doped metal layer 204, the seed layer 203 and the adhesion layer 202 on surface of the dielectric layer 200 may be removed. Thus, the adhesion film 202a, the seed film 203a and the doped metal film 204a may be formed. The top surface of the adhesion film 202a, the seed film 203a and the doped metal film 204a may level with the top surface of the dielectric film 200.

The seed film 203a and the doped metal film 204a may be together configured as the metal layer of the BEC. The BEC may electrically connect with the metal interconnect structures in the substrate 100. For example, the BEC may be formed on a W-plug of the metal interconnect structure in the substrate 100

Returning to FIG. 9, after forming the BEC, a phase change layer may be formed (S107). FIG. 8 illustrates a corresponding structure.

As shown in FIG. 8, a phase change layer 300 is formed on the surfaces of the adhesion film 202a, the seed film 203a and the doped metal film 204a. That is, the BEC may be connected with the phase change layer 300; and the phase change layer 300 may be heated when an electrical current is applied.

The phase change layer 300 may be made of any appropriate material, such as Si—Sb—Te, Ge—Sb—Te (GST), Ag—In—Te, or Ge—Bi—Te, etc. In one embodiment, the phase change layer 300 is made of GST. Various process may be used to form the phase change layer 300, such as a CVD process, a PVD process, an ALD process, a low-pressure CVD process, a flowable CVD process, or a plasma-enhanced CVD process, etc.

Further, after forming the phase change layer 300, a top electrode may be formed on the phase change layer 300. Thus, a PCRAM may be formed. In certain other embodiments, the phase change layer 300 may be patterned by an appropriate process; and then a top electrode may be formed on the patterned phase change layer.

Thus, a PCRAM may be formed by the above disclosed processes and methods;

and the corresponding PCRAM is illustrated in FIG. 8. As shown in FIG. 8, the PCRAM may include a substrate 100; and a dielectric layer 200 formed on the surface of the substrate 100. The PCRAM may also include a BEC including a seed film 203a and a doped metal film 204a formed on the substrate 100 and in the dielectric layer 200. The top surface of the seed film 203a and the top surface of the doped metal film 204a may level with the top surface of the dielectric layer 200. Further, the PCRAM may also include an adhesion film 202a formed between the dielectric layer 200 and the BEC and between the substrate 100 and the BEC. Further, the PCRAM may also include a phase change layer 300 formed on the surfaces of the dielectric layer 200, the adhesion film 202a, the seed film 203a and the doped metal layer 204a. Further, the PCRAM may also include a top electrode (not shown) formed on the phase change layer 300. The detailed structures and intermediate structures are described above with respect to the fabrication processes.

According to the disclosed methods and structures, because the metal layer may be doped with inorganic ions, during the planarization process, the over-etching issue may be improved. Thus, the quality of the interface between the doped metal layer (BEC) and the phase change layer may be improved; and the performance of the PCRAM may be improved.

Further, the inorganic doping ions may increase the resistance of the doped metal layer and reduce the thermal conductivity of the doped metal layer. Thus, the heating efficiency of the doped metal layer to the phase change layer may be increased. Therefore, the power consumption of the PCRAM unit may be improved; and the performance of the PCRAM may be enhanced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a phase change random access memory, comprising:
    providing a substrate having a surface;
    forming a dielectric layer on the surface of the substrate;
    forming a through-hole penetrating through the dielectric layer;
    forming an adhesion layer on an inner surface of the through-hole;
    forming a protective silicon layer on the adhesion layer using a soaking process;
    after the soaking process, introducing WF6 and a doping gas into a reaction chamber simultaneously to form a foundation layer containing a metal-inorganic-material compound on the protective silicon layer using a nucleation process,
    wherein,
    the protective silicon layer prevents the adhesion layer from reacting with the WF6 and the doping gas while the protective silicon layer is used as nucleation sites,
    the doping gas is superfluous and the mole ratio of the doping gas to the WF6 is greater than approximately ⅔, and
    the adhesion layer and the foundation layer form a seed layer;
    doping the seed layer with inorganic ions to increase a resistance of the seed layer and reduce a thermal conductivity of the seed layer;
    forming a metal layer containing metal plus the inorganic ions on the seed-layer using one of a chemical vapor deposition process and an atomic layer deposition process to reduce over-etching of the metal layer and increase heating efficiency of the metal layer on the surface of the adhesion layer; and
    forming a phase change layer on the dielectric layer, the adhesion layer and the doped metal layer.

2. The method according to claim 1, wherein:
    the metal layer is made of the metal including pure W.

3. The method according to claim 1, wherein:
    the inorganic ions include one of C ions, N ions, Ge ions and Si ions.

4. The method according to claim 1, wherein:
    a mole concentration of the inorganic ions in the metal layer is in range of less than 66%.

5. The method according to claim 1, after forming the metal layer, further including:
    planarizing the metal layer containing the pure metal plus the doped inorganic ions and the adhesion layer to form an adhesion film in the through-hole and a doped metal film on the adhesion film after planarizing.

6. The method according to claim 5, wherein:
    after planarizing, top surfaces of the doped metal film and the adhesion film are coplanar with a top surface of the dielectric layer.

7. The method according to claim 1, wherein:
    when the metal layer doped with the inorganic ions is formed by the chemical vapor deposition process, reaction gases of the chemical vapor deposition process include $WF_6$ and a doping gas including one of $SiH_4$, $CH_4$, $GeH_4$ and $NH_3$.

8. The method according to claim 7, wherein:
    a flow rate of $WF_6$ is in a range of approximately 20 sccm~500 sccm;
    a flow rate of the doping gas is in a range of approximately 20 sccm~500 sccm;
    a reaction temperature is in a range of approximately 300° C.~500° C.;
    a pressure of the chemical vapor deposition process is in a range of approximately 0.5 Torr~50 Torr.

9. The method according to claim 1, wherein:
    the seed layer is made of one or more of W, Si, and Si-doped W.

10. The method according to claim 1, wherein:
    the phase change layer is made of one of Si—Sb—Te, Ge—SB—Te, Ag—In—Te and Ge—Bi—Te.

11. The method according to claim 1, wherein the adhesion layer includes:
    a Ti layer formed on the inner surface of the through-hole, and
    a TiN layer formed on the Ti layer.

12. The method according to claim 1, wherein the adhesion layer includes:
    a Ta layer formed on the inner surface of the through-hole, and
    a TaN layer formed on the Ta layer.

13. The method according to claim 1, wherein:
    the adhesion layer has a thickness in a range of approximately 50 Å to 500 Å.

14. The method according to claim 1, wherein:
    the seed particles include pure Si, and
    the metal-inorganic-material compound includes at least one of WSi, WC, WGe, and WN.

15. The method according to claim 1, wherein:
    the foundation layer is a WSi layer.

* * * * *